US012666918B2

(12) United States Patent
Lee et al.

(10) Patent No.: US 12,666,918 B2
(45) Date of Patent: Jun. 23, 2026

(54) SUBSTRATE SUPPORT DEVICE AND SUBSTRATE PROCESSING APPARATUS INCLUDING THE SAME

(71) Applicant: SEMES CO., LTD., Chungcheongnam-do (KR)

(72) Inventors: Dongchan Lee, Gyeonggi-do (KR); Su Hyung Lee, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 540 days.

(21) Appl. No.: 18/311,999

(22) Filed: May 4, 2023

(65) Prior Publication Data

US 2023/0377932 A1     Nov. 23, 2023

(30) Foreign Application Priority Data

May 19, 2022     (KR) ......................... 10-2022-0061551

(51) Int. Cl.
  *H10P 72/72*          (2026.01)
  *H01J 37/32*          (2006.01)
(52) U.S. Cl.
  CPC ...... *H10P 72/722* (2026.01); *H01J 37/32082* (2013.01); *H01J 37/32724* (2013.01); *H01J 2237/327* (2013.01)
(58) Field of Classification Search
  CPC ............... H10P 72/722; H01J 37/32082; H01J 37/32724; H01J 2237/327
  See application file for complete search history.

(56) References Cited

U.S. PATENT DOCUMENTS

| | | | |
|---|---|---|---|
| 6,853,533 B2 | 2/2005 | Parkhe | |
| 9,117,867 B2 | 8/2015 | Hwang et al. | |
| 9,438,140 B2 | 9/2016 | Takasaki et al. | |
| 9,728,437 B2 | 8/2017 | Tran et al. | |
| 2004/0063312 A1* | 4/2004 | Strang ............... | H01L 21/68785 |
| | | | 438/663 |
| 2004/0115947 A1* | 6/2004 | Fink ................... | H01L 21/67103 |
| | | | 438/716 |
| 2009/0014323 A1 | 1/2009 | Yendler et al. | |

(Continued)

FOREIGN PATENT DOCUMENTS

| | | |
|---|---|---|
| JP | 2013-145859 A | 7/2013 |
| JP | 5660753 B2 | 1/2015 |

(Continued)

OTHER PUBLICATIONS

Office Action issued in corresponding KR Patent Application No. 10-2022-0061551, dated Feb. 15, 2024, pp. 1-6.

*Primary Examiner* — Yuechuan Yu
(74) *Attorney, Agent, or Firm* — Carter, DeLuca & Farrell LLP

(57) ABSTRACT

A substrate support device according to one aspect of the present invention includes a seating plate part on which a substrate is seated, a shaft part coupled to a lower portion of the seating plate part to support the seating plate part, and a gap flange part coupled to the shaft part or the seating plate part to define a thermal insulation gap between the shaft part and the gap flange part and between the seating plate part and the gap flange part, the gap flange part including a gas inlet port and a gas outlet port so that cooling gas circulates in the thermal insulation gap.

11 Claims, 8 Drawing Sheets

(56) References Cited

U.S. PATENT DOCUMENTS

| | | | |
|---|---|---|---|
| 2015/0083042 A1* | 3/2015 | Kobayashi ........ | H01J 37/32357 |
| | | | 118/500 |
| 2020/0035535 A1 | 1/2020 | Parkhe | |
| 2022/0223384 A1* | 7/2022 | Takada ............. | H01L 21/67109 |

FOREIGN PATENT DOCUMENTS

| | | | |
|---|---|---|---|
| JP | 5989593 | B2 | 9/2016 |
| JP | 6223333 | B2 | 11/2017 |
| KR | 20010111058 | A | 12/2001 |
| KR | 10-2014-0045999 | A | 4/2014 |
| KR | 20170108152 | A | 9/2017 |

* cited by examiner

140a 445                                    0

SUBSTRATE SUPPORT DEVICE AND SUBSTRATE PROCESSING APPARATUS INCLUDING THE SAME

CROSS-REFERENCE TO RELATED APPLICATIONS

This application claims priority to and the benefit of Korean Patent Application No. 10-2022-0061551 filed in the Korean Intellectual Property Office on May 19, 2022, the entire contents of which are incorporated herein by reference.

TECHNICAL FIELD

The present invention relates to a process of manufacturing a semiconductor, and more particularly, to a substrate support device and a substrate processing apparatus including the same that are used to manufacture a semiconductor.

BACKGROUND ART

Various types of processes may be performed by a substrate processing apparatus in a vacuum ambience to manufacture semiconductor elements. For example, a substrate may be loaded into a process chamber of the substrate processing apparatus, and an etching process may be performed to etch a thin film. The substrate may be supported by a substrate support device in the process chamber and heated to an appropriate process temperature by the substrate support device.

Typically, because a temperature of the substrate support device needs to be kept higher than that of the process chamber, it is necessary to block heat transfer from the substrate support device to the process chamber. In this case, a height of the substrate support device needs to be increased, but the increase in height may affect the substrate etching process. Accordingly, there is a need to ensure thermal insulation and cooling performance for the substrate support device while reducing an overall height of the substrate support device.

SUMMARY OF THE INVENTION

The present invention has been made in an effort to solve the above-mentioned problem, and an object of the present invention is to provide a substrate support device and a substrate processing apparatus including the same, which are capable of ensuring thermal insulation and cooling performance while reducing an overall height. However, the object of the present invention is illustrative, and the scope of the present invention is not limited by the object.

An exemplary embodiment of the present invention provides a substrate support device including: a seating plate part on which a substrate is seated; a shaft part coupled to a lower portion of the seating plate part to support the seating plate part; and a gap flange part coupled to the shaft part or the seating plate part to define a thermal insulation gap between the shaft part and the gap flange part and between the seating plate part and the gap flange part, the gap flange part including a gas inlet port and a gas outlet port so that cooling gas circulates in the thermal insulation gap.

According to the substrate support device, the gap flange part may include a wing portion extending along the seating plate part, and a sealing member may be interposed between the wing portion and the seating plate part and surround the shaft part to seal the thermal insulation gap.

According to the substrate support device, one or more cap members may be interposed between the wing portion and the seating plate part to surround the sealing member.

According to the substrate support device, one or more one protruding portions each having a shape surrounding the shaft part may be formed on the wing portion, and the one or more cap members may be fitted with the one or more protruding portions.

According to the substrate support device, the one or more cap members may include a pair of cap members disposed to be spaced apart from each other to define an additional thermal insulation gap between the wing portion and the seating plate part.

According to the substrate support device, the wing portion may further extend to the outside of the seating plate part, and an outer cap member of the pair of cap members may be disposed to support a lower side of an outer peripheral surface of the seating plate part.

According to the substrate support device, the gap flange part may include a ring portion connected to the wing portion and extending along the shaft part while surrounding the shaft part, and the gas inlet port and the gas outlet port may be formed in the ring portion.

According to the substrate support device, a heat sink flange part may be coupled to a lower portion of the shaft part, and the gap flange part may be fastened to the heat sink flange part.

According to the substrate support device, an O-ring may be interposed between the heat sink flange part and the gap flange part to seal the thermal insulation gap.

The substrate support device may further include: a cooling plate detachably coupled to an outer side of the gap flange part.

According to the substrate support device, a cooling flow path may be formed in the cooling plate.

According to the substrate support device, an electrostatic electrode, a heating wire, and an RF electrode may be disposed in the seating plate part, and power rods connected to the electrostatic electrode, the heating wire, and the RF electrode may be disposed in the shaft part.

Another exemplary embodiment of the present invention provides a substrate support device including: a seating plate part on which a substrate is seated; a shaft part coupled to a lower portion of the seating plate part to support the seating plate part and having a lower portion to which a heat sink flange part is coupled; a gap flange part fastened to the heat sink flange part to define a thermal insulation gap between the shaft part and the seating plate part and including a gas inlet port and a gas outlet port so that cooling gas circulates in the thermal insulation gap; and a cooling plate detachably coupled to an outer side of the gap flange part, in which the gap flange part includes: a wing portion extending along the seating plate part; and a ring portion connected to the wing portion and extending along the shaft part while surrounding the shaft part, in which a sealing member is interposed between the wing portion and the seating plate part and surrounds the shaft part to seal the thermal insulation gap, and in which one or more cap members are interposed between the wing portion and the seating plate part to surround the sealing member.

Still another exemplary embodiment of the present invention provides a substrate processing apparatus including: a process chamber having a reaction space; and a substrate support device coupled to the process chamber to support a substrate in the reaction space, in which the substrate support device includes: a seating plate part on which the substrate is seated; a shaft part coupled to a lower portion of the seating plate part to support the seating plate part; a gap flange part coupled to the shaft part or the seating plate part to define a thermal insulation gap between the shaft part and the gap flange part and the seating plate part and the gap flange part; and a cooling plate detachably coupled to an outer side of the gap flange part.

According to the substrate support device and the substrate processing apparatus according to some embodiments of the present invention described above, it is possible to ensure thermal insulation and cooling performance while reducing the overall height. Of course, the scope of the present invention is not limited by the effects.

DETAILED DESCRIPTION

Figure 1:
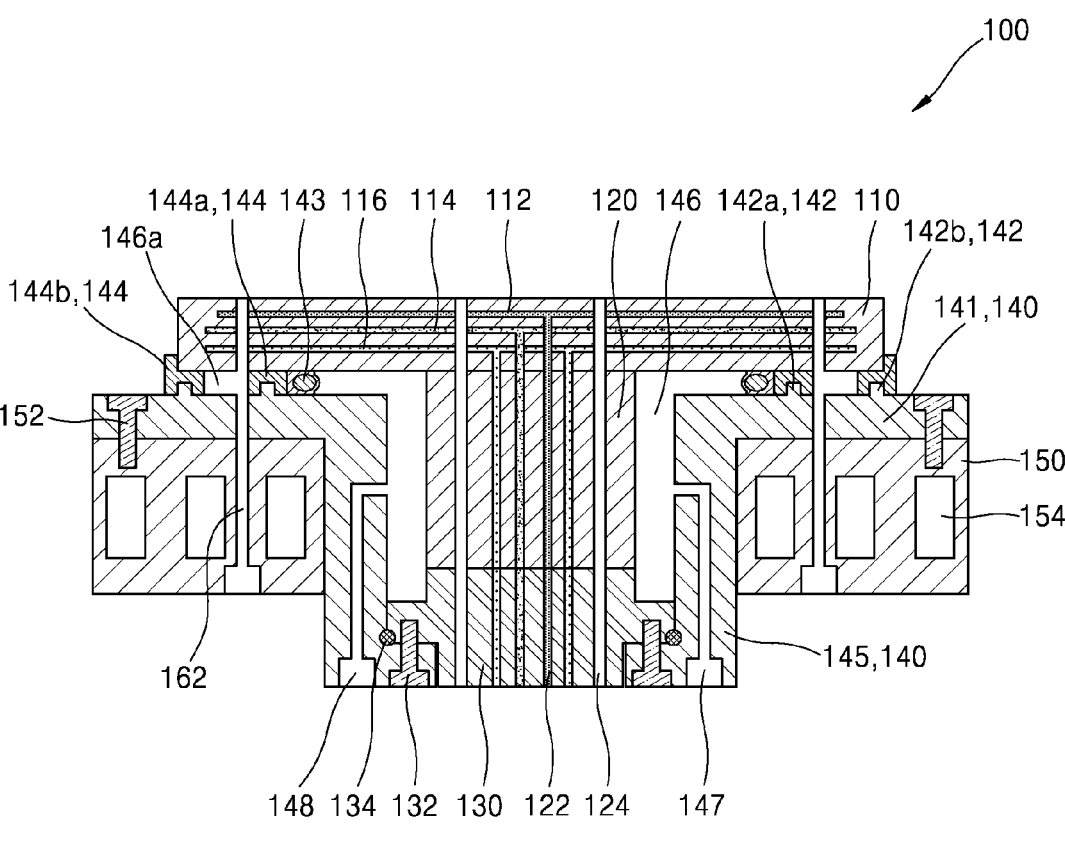
FIG. 1 is a schematic cross-sectional view illustrating a substrate support device according to an embodiment of the present invention.

Hereinafter, exemplary embodiments of the present invention will be described in detail with reference to the accompanying drawings.

Embodiments of the present invention are provided to more completely explain the present invention to those skilled in the art. The following embodiments may be modified in various forms, and the scope of the present invention is not limited to the following embodiments. The embodiments are provided to make the present invention more thorough and complete, and to completely convey the spirit of the present invention to those skilled in the art. In addition, a thickness or size of each layer illustrated in the drawings is exaggerated for the purpose of clarity and for convenience of description.

Hereinafter, the embodiments of the present invention will be described with reference to the drawings that schematically illustrate ideal embodiments of the present invention. In the drawings, for example, depending on manufacturing techniques and/or tolerance, variations of the illustrated shape may be expected. Therefore, it should be interpreted that the embodiments based on the spirit of the present invention are not limited to particular shapes of regions illustrated in the present specification but include changes in shapes made during a manufacturing procedure, for example.

Figure 2:
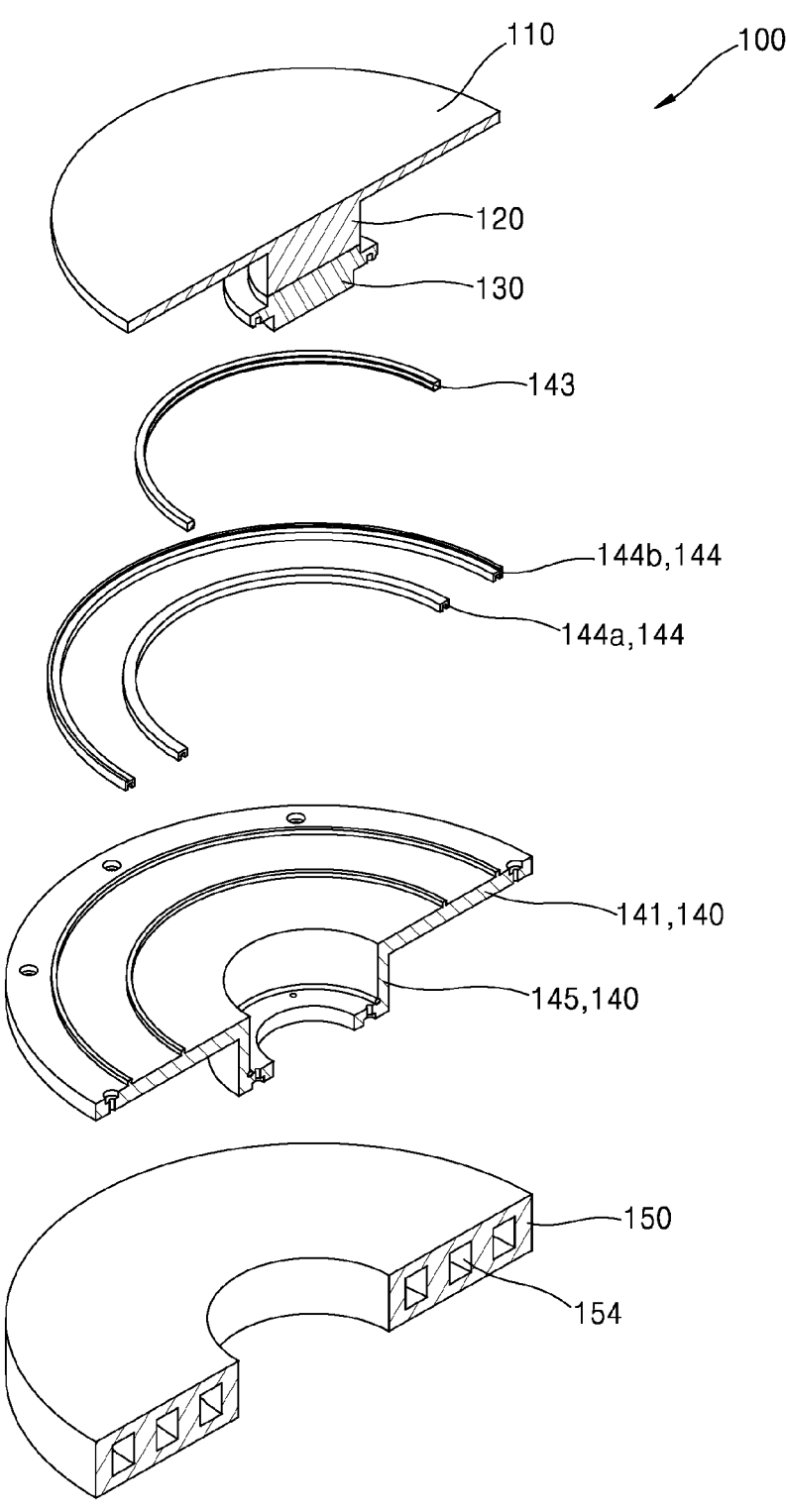
FIG. 2 is an exploded perspective view illustrating a partially cut shape of the substrate support device in FIG. 1.

FIG. 1 is a schematic cross-sectional view illustrating a substrate support device according to an embodiment of the present invention, and FIG. 2 is an exploded perspective view illustrating a partially cut shape of the substrate support device in FIG. 1.

Referring to FIGS. 1 and 2, a substrate support device 100 may serve to support a substrate and include a seating plate part 110, a shaft part 120, and a gap flange part 140.

A substrate (see S in FIG. 7) may be seated on the seating plate part 110. For example, a groove may be formed in an upper surface of the seating plate part 110, and the substrate S may be seated in the groove. A shape of the seating plate part 110 approximately may correspond to a shape of the substrate S, but the present invention is not limited thereto. The seating plate part 110 may have various shapes larger than the substrate S so that the substrate S may be stably seated. For example, the substrate S may be a semiconductor wafer. In this case, the seating plate part 110 may have a circular plate shape corresponding to a shape of the wafer.

The seating plate part 110 may be made of various materials, for example, a ceramic material. For example, the seating plate part 110 may be formed by sintering ceramic powder, for example, AlN powder. In case that the seating plate part 110 is made of a ceramic material and provided in the form of a circular plate, the seating plate part 110 may be called a ceramic puck.

The shaft part 120 may be coupled to a lower portion of the seating plate part 110 to support the seating plate part 110. More specifically, the shaft part 120 may be coupled to a lower surface of the seating plate part 110. For example, the shaft part 120 may be joined to and integrated with the lower surface of the seating plate part 110 by a method such as hot press or brazing. The shaft part 120 may serve to support the seating plate part 110 and make the seating plate part 110 spaced upward. The shaft part 120 may be manufactured in various shapes, for example, in a hollow cylindrical shape so that a structure may be inserted into the shaft part 120.

The gap flange part 140 may be coupled to the shaft part 120 or the seating plate part 110 while defining a thermal insulation gap 146. For example, the gap flange part 140 may be tightly fixed to the seating plate part 110 and the shaft part 120 so that the thermal insulation gap 146 is defined between the seating plate part 110 and the gap flange part 140 and between the shaft part 120 and the gap flange part 140. The gap flange part 140 may have a bent shape corresponding to a part of the seating plate part 110 and a part of the shaft part 120. A part of the gap flange part 140 is disposed to be spaced apart from the seating plate part 110 and the shaft part 120, such that the thermal insulation gap 146 may be defined between the seating plate part 110 and the gap flange part 140 and between the shaft part 120 and the gap flange part 140.

The gap flange part 140 may include a gas inlet port 147 and a gas outlet port 148 so that cooling gas circulates in the thermal insulation gap 146. The gas inlet port 147 and the gas outlet port 148 may be formed through a part of the gap flange part 140 so as to communicate with the thermal insulation gap 146. For example, the cooling gas may be introduced into the thermal insulation gap 146 through the gas inlet port 147 and discharged through the gas outlet port 148. The number of gas inlet ports 147 may be appropriately selected to be one or more, and the number of gas outlet ports 148 may be appropriately selected to be one or more. The gas inlet port 147 and the gas outlet port 148 may be connected to an external gas pipe.

For example, the gap flange part 140 may include a wing portion 141 and a ring portion 145. The wing portion 141 may extend along the seating plate part 110. The ring portion 145 may be connected to the wing portion 141 and extend along the shaft part 120 while surrounding the shaft part 120. For example, in the gap plate part 140, the wing portion 141 and the ring portion 145 may be manufactured as an integrated structure. Further, the gas inlet port 147 and the gas outlet port 148 may be formed in the ring portion 145. For example, the gas inlet port 147 and the gas outlet port 148 may extend from a lower surface of the ring portion 145 to the thermal insulation gap 146.

In some embodiments, the gas inlet port 147 and the gas outlet port 148 may be excluded from the gap flange part 140. The cooling gas may not circulate in the thermal insulation gap 146 in case that sufficient thermal insulation may be implemented by the thermal insulation gap 146 and the other configurations.

A sealing member 143 may be interposed between the wing portion 141 and the seating plate part 110 and surround the shaft part 120 to seal the thermal insulation gap 146. For example, the sealing member 143 may be made of metal, for example, titanium or the like and formed in a ring shape to maintain strength at the time of sealing the thermal insulation gap.

In some embodiments, one or more cap members 144 may be interposed between the wing portion 141 and the seating plate part 110 while surrounding the sealing member 143. For example, one or more protruding portions 142 having a shape surrounding the shaft part 120 may be formed on the wing portion 141, and the cap member 144 may be fitted with the protruding portion 142.

The protruding portions 142 may include a pair of protruding portions 142a and 142b, and the cap members 142 may include a pair of cap members 144a and 144b. The cap members 144a and 144b may be fitted with the protruding portions 142a and 142b, respectively. The cap members 144a and 144b may be disposed to be spaced apart from each other to define an additional thermal insulation gap 146a between the wing portion 141 and the seating plate part 110.

For example, the cap members 144a and 144b may each be made of a high-strength, low-thermal conduction material, for example, titanium (Ti) or the like so that the cap members 144a and 144b may each have appropriate rigidity while implementing thermal insulation between the seating plate part 110 and the gap flange part 140.

In some embodiments, the wing portion 141 may further extend to the outside of the seating plate part 110. The cap member 144b, which is an outer cap member of the cap members 144a and 144b, may be disposed to support a lower side of an outer peripheral surface of the seating plate part 110. For example, the cap member 144b may include a lateral support portion provided on a dome shape fitted with the protruding portion 142b, and the lateral support portion may protrude upward to support the lower side of the outer peripheral surface of the seating plate part 110.

A heat sink flange part 130 may be coupled to a lower portion of the shaft part 120. For example, the heat sink flange part 130 may be joined to the lower surface of the shaft part 120 by a method such as hot press or brazing. The heat sink flange part 130 may be connected to a lower surface of the shaft part 120 and serve to absorb heat through the shaft part 130. To this end, the heat sink flange part 130 may be made of metal.

In some embodiments, in case that the heat sink flange part 130 is integrated with the shaft part 120, the heat sink flange part 130 may be interpreted as a part of the shaft part 120. In some embodiments, the heat sink flange part 130 may not be separately coupled, but a fastening part may be formed on the shaft part 120 to fasten the gap flange part 140.

The gap flange part 140 may be fastened to the heat sink flange part 130. For example, in the state in which the sealing member 143 is interposed between the cap members 144a and 144b, the gap flange part 140 may be tightly attached to the seating plate part 110, and then the lower portion of the ring portion 145 of the gap flange part 140 may be fastened to the heat sink flange part 130 by using a fastening means 132. In addition, an O-ring 134 may be further interposed between the heat sink flange part 130 and the gap flange part 140 to seal the thermal insulation gap 146.

In this case, it is possible to minimize contact between the gap flange part 140 and the seating plate part 110, except for the structure disposed between the gap flange part 140 and the seating plate part 110 to define the thermal insulation gap 146 and the additional thermal insulation gap 146a. For example, the sealing member 143 and/or the cap members 144a and 144b may be interposed between the wing portion 141 of the gap flange part 140 and a rear surface of the seating plate part 110, thereby minimizing heat transfer therebetween and preventing damage caused by thermal deformation of the gap flange part 140.

A cooling plate 150 may be further detachably coupled to an outer side of the gap flange part 140. A cooling flow path 154 may be formed in the cooling plate 150, and a cooling medium may circulate through the cooling flow path 154. The cooling plate 150 may be made of a metallic material, for example, aluminum (Al) or the like and used to remove heat transferred to the gap flange part 140. Further, the gap flange part 140 may be made of a high-thermal conduction, rigid material, for example, metal to transfer heat to the cooling plate 150.

Figure 3:
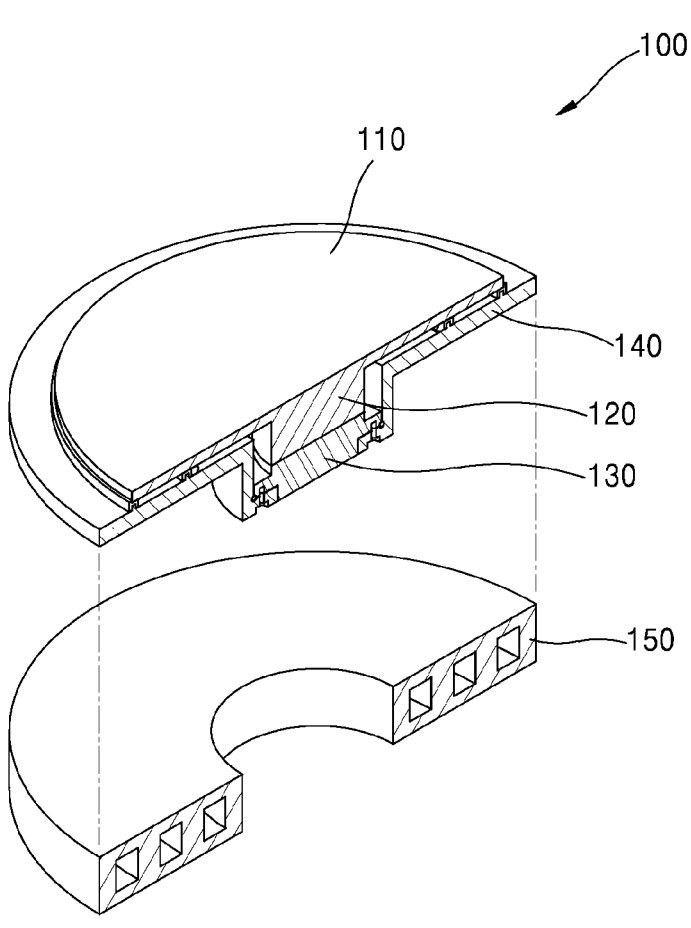
FIG. 3 is a perspective view illustrating a partially cut shape of the substrate support device in FIG. 1 from which a cooling plate is detached.

For example, the cooling plate 150 may be provided in the form of a hollow circular plate that surrounds the ring portion 145. The cooling plate 150 may be detachably fastened to the wing portion 141 by using a fastening member 152. Therefore, as illustrated in FIG. 3, the cooling plate 150 may be detached from the gap flange part 140 and separately replaced.

In some embodiments, at least one of an electrostatic electrode 112, a heating wire 114, and an RF electrode 116 may be disposed in the seating plate part 110. For example, the electrostatic electrode 112 may serve to fix the substrate S to the seating plate part 110 by applying an electrostatic force to the substrate S. The heating wire 114 may be used to heat the substrate S by heating the seating plate part 110. The RF electrode 116 may be used to apply RF electric power to implement a plasma environment on the seating plate part 110. In case that the electrostatic electrode 112 is embedded in the seating plate part 110, the substrate support device 100 may be called an electrostatic chuck.

RF rods 122 may be disposed in the shaft part 120 and connected to the electrostatic electrode 112, the heating wire 114, and the RF electrode 116. For example, the shaft part 120 may have a hollow portion, and the RF rods 122 may be inserted into the hollow portion. The RF rod 122 connected to the electrostatic electrode 112 may be connected to an external DC power source, the RF rod 122 connected to the heating wire 114 may be connected to an external heater power source, and the RF rod 122 connected to the RF electrode 116 may be connected to an external plasma power source.

Meanwhile, in case that the substrate S is fixed by other methods instead of the electrostatic force, the electrostatic electrode 112 may be excluded from the interior of the seating plate part 110. Further, in case that the plasma environment is not required or the plasma electric power is connected to other parts instead of the substrate support device 100, the electrostatic electrode 112 may be excluded from the interior of the seating plate part 110.

A gas supply line 124 may be further disposed in the shaft part 120 to supply gas onto the seating plate part 110. For example, the gas supply line 124 may be used to supply inert gas, argon (Ar), helium (He), and the like to a rear surface of the substrate S.

Figure 4:
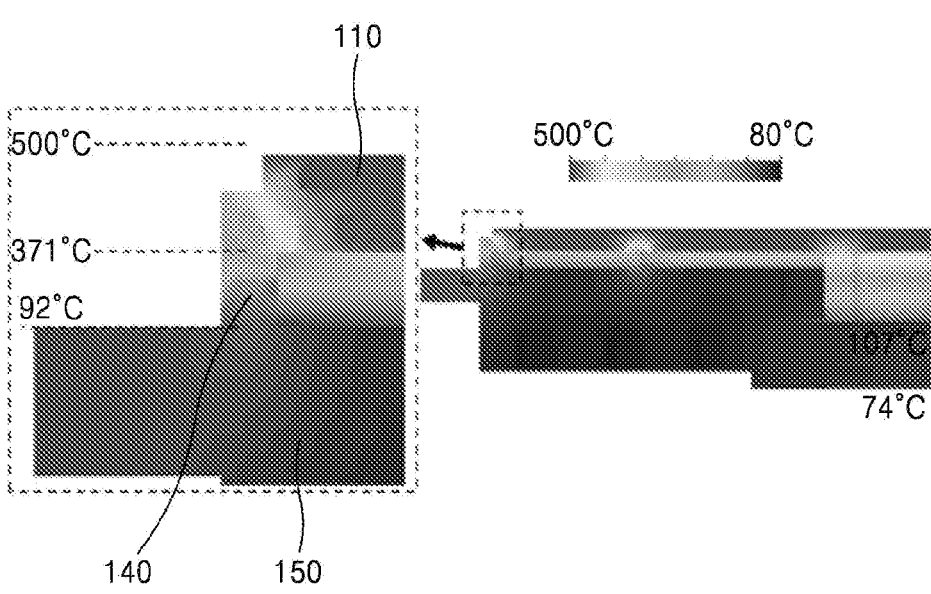
FIG. 4 is a schematic view illustrating a temperature distribution on the substrate support device according to the embodiment of the present invention.

FIG. 4 is a schematic view illustrating a temperature distribution on the substrate support device 100 according to the embodiment of the present invention.

Referring to FIG. 4, it can be seen that the gap plate part 140 and the cooling plate 150 are maintained at a low temperature, and the thermal insulation gap 146 effectively blocks heat of the seating plate part 110.

Figure 5A:
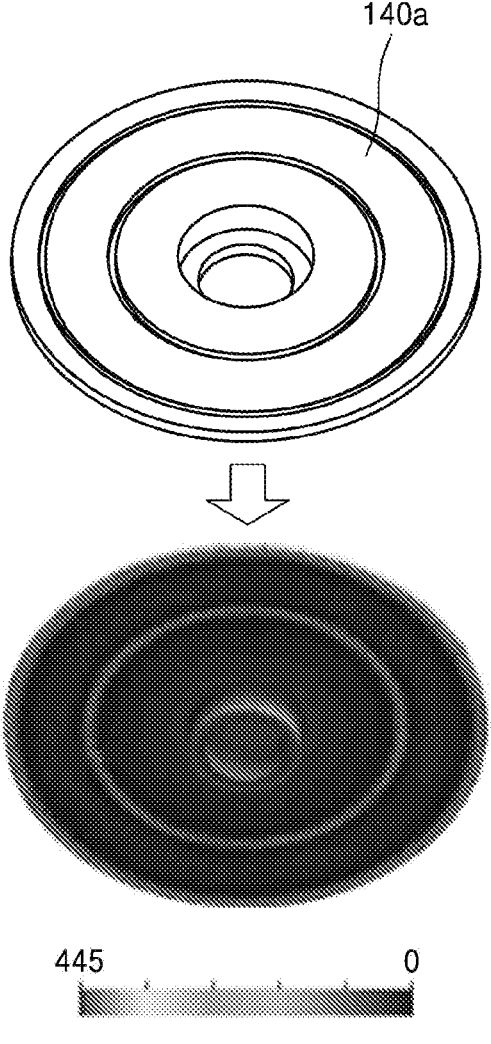
FIG. 5A is a schematic view illustrating a temperature distribution on a gap flange part with the absence of a cap member in the embodiments of the present invention.
Figure 5B:
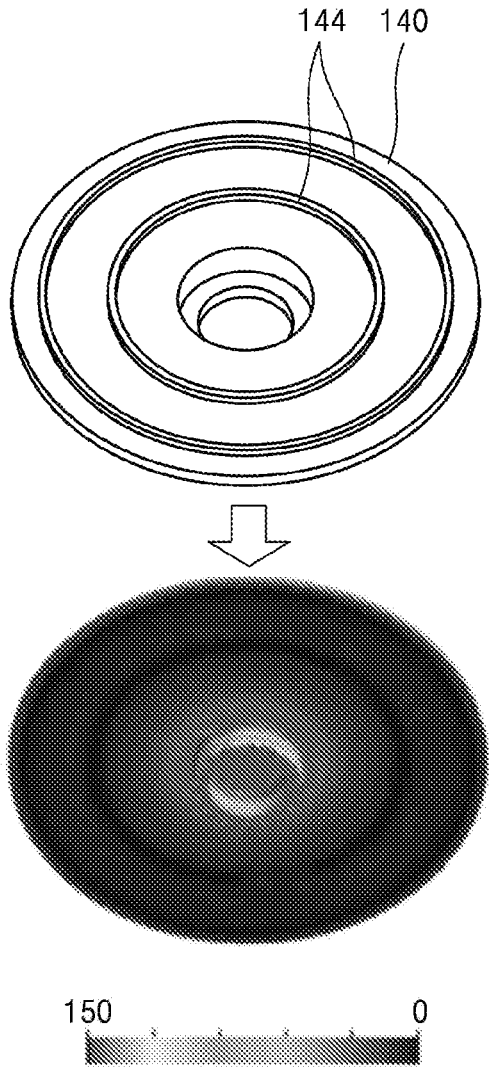
FIG. 5B is a schematic view illustrating a temperature distribution on the gap flange part with the presence of the cap member in the embodiments of the present invention.

FIG. 5A is a schematic view illustrating a temperature distribution on a gap flange part 140a with the absence of a cap member in the embodiments of the present invention, and FIG. 5B is a schematic view illustrating a temperature distribution on the gap flange part 140 with the presence of the cap member in the embodiments of the present invention.

Referring to FIG. 5A, there is concern that even the interior of the ring portion 145 is cooled in the cap flange part 140a, and the shaft part 120 is cooled.

Referring to FIG. 5B, it can be seen that the additional thermal insulation gap 146a may be defined by the cap member 144 in the cap flange part 140, such that the interior and exterior of the ring portion 145 are thermally insulated. Therefore, it can be seen that thermal insulation efficiency is further improved by applying the cap member 144.

According to the substrate support device 100 described above, the gap flange part 140 may be used to define the thermal insulation gap 146, such that the thermal insulation efficiency may be improved, and the cooling gas may circulate in the thermal insulation gap 146. Therefore, it is possible to reduce or prevent heat transfer to the lower portion of the seating plate part 110 and the outer peripheral surface of the shaft part 120. Further, the heat sink flange part 130 may absorb heat transferred to the lower side of the shaft part 120, thereby reducing or preventing heat transfer to the lower portion of the shaft part 120.

The cooling plate 150 may be used to cool the gap flange part 140, thereby further preventing heat transfer to the lower portion of the seating plate part 110 and the outer peripheral surface of the shaft part 120. As described above, because the heat transfer is effectively prevented, the height of the shaft part 120 may be reduced, such that the overall height of the substrate support device 100 may be reduced.

Figure 6:
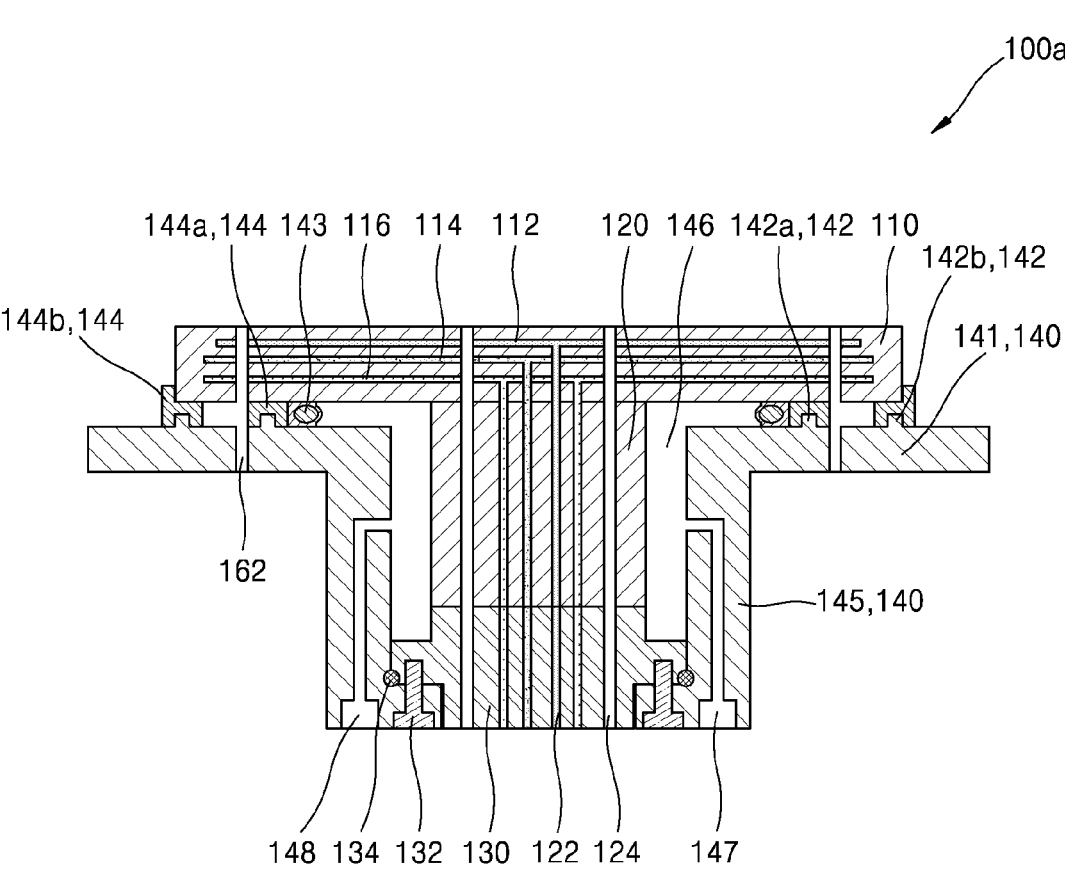
FIG. 6 is a schematic cross-sectional view illustrating a substrate support device according to another embodiment of the present invention.

FIG. 6 is a schematic cross-sectional view illustrating a substrate support device 100a according to another embodiment of the present invention.

Referring to FIG. 6, unlike the substrate processing apparatus 100, the substrate processing apparatus 100a may exclude the cooling plate 150. In this case, the cooling gas circulating in the thermal insulation gap 146 may be efficiently supplied to the gap flange part 140, which makes it possible to improve thermal insulation efficiency.

Figure 7:
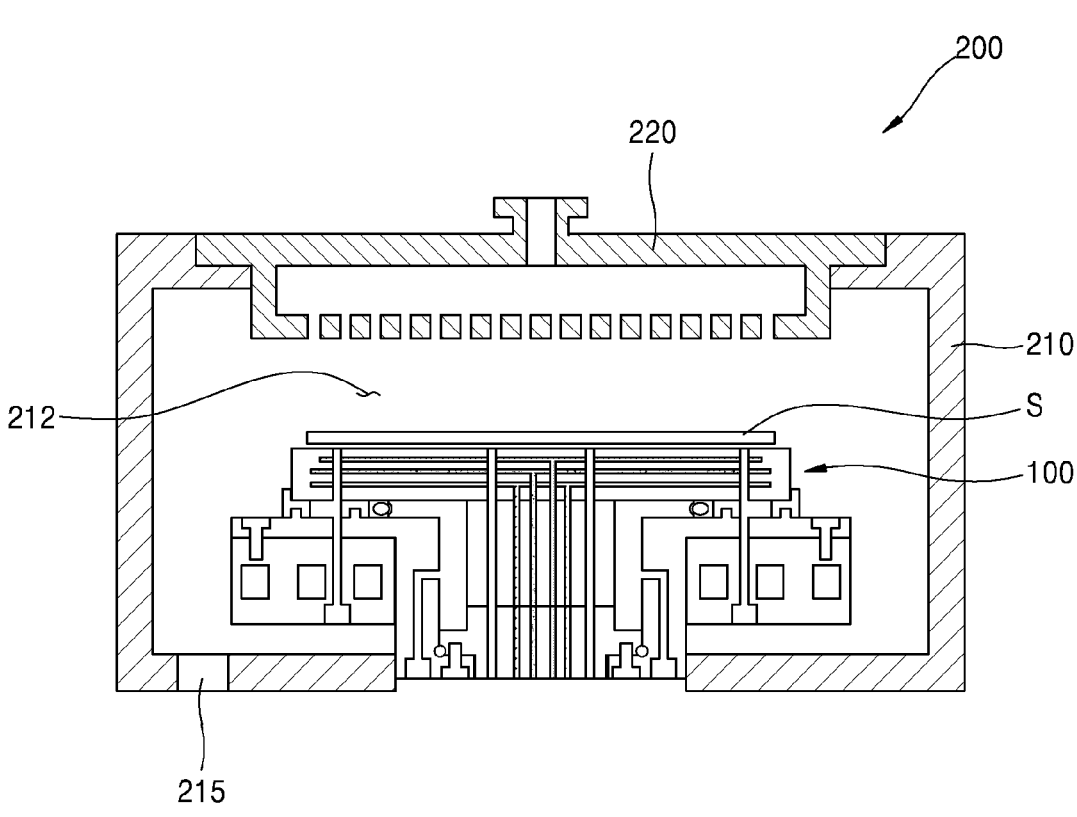
FIG. 7 is a schematic cross-sectional view illustrating a substrate processing apparatus according to still another embodiment of the present invention.

FIG. 7 is a schematic cross-sectional view illustrating a substrate processing apparatus 200 according to still another embodiment of the present invention.

Referring to FIG. 7, the substrate processing apparatus 200 may include a process chamber 210 and the substrate support device 100.

More specifically, a reaction space 212 may be formed in the process chamber 210. For example, the reaction space 212 may be formed in the process chamber 210, and the substrate S may be processed in the reaction space 212. A discharge port 215 may be formed in the process chamber 210. The discharge line may be connected to the discharge port 215, and a vacuum pump (not illustrated) may be connected to the discharge line, such that a vacuum environment may be adjusted in the process chamber 210. Further, a post-process apparatus for treating exhaust gas may be additionally provided in the discharge line.

The substrate support device 100 may be coupled to the process chamber 210 to support the substrate S in the reaction space 212. The most part of the substrate support device 100 may be disposed in the process chamber 210, and a part of the substrate support device 100 may be exposed to the outside of the process chamber 210. For example, the substrate support device 100 may be coupled to the process chamber 210 so that a part of a bottom surface of the substrate support device 100 may be at least exposed to a lower side of the process chamber 210 so that the power rods 122, the gas supply line 124, the gas inlet port 147, the gas outlet port 148, and the like may be connected to a power source apparatus, a gas supply apparatus, and the like disposed outside the process chamber 210. A portion where the substrate support device 100 and the process chamber 210 are coupled may be sealed to seal the interior of the process chamber 210.

In some embodiments, the substrate support device 100 may be substituted with the substrate support device 100a.

A gas spray part 220 may be further coupled to the process chamber 210 to spray process gas onto the substrate S. For example, the gas spray part 220 may be coupled to an upper portion of the process chamber 210 and spray the process gas, which is supplied from the outside, into the reaction space 212. The gas spray part 220 may be variously modified in shapes and called a shower head, a nozzle, an injector, and the like.

The substrate processing apparatus 200 is an apparatus for processing the substrate S. For example, the substrate processing apparatus 200 may be used as a substrate etching apparatus used to etch a part of the substrate S.

According to the substrate processing apparatus 200, the thermal insulation gap 146 may be defined by using the gap flange part 140, such that thermal insulation efficiency may be improved. Further, the heat sink flange part 130 may be used to absorb heat transferred to the lower side of the shaft part 120, which makes it possible to reduce or prevent heat transfer from the substrate support device 100 to the process chamber 210. Further, the cooling plate 150 may be used to cool the gap flange part 140, which makes it possible to reduce or prevent heat transfer from the substrate support device 100 to the process chamber 210. As described above, because the heat transfer is effectively prevented, the height of the shaft part 120 may be reduced, such that the overall heights of the substrate support device 100 and the process chamber 210 may be reduced. Therefore, it is possible to improve efficiency in processing the substrate S in the substrate processing apparatus 200.

While the present invention has been described with reference to the embodiment illustrated in the drawings, the embodiment is described just for illustration, and those skilled in the art to which the present invention pertains will understand that various modifications of the embodiment and any other embodiment equivalent thereto are available. Accordingly, the true technical protection scope of the present invention should be determined by the technical spirit of the appended claims.

What is claimed is:

1. A substrate support device comprising: a seating plate part on which a substrate is seated; a shaft part coupled to a lower portion of the seating plate part to support the seating plate part; and a gap flange part coupled to the shaft part or the seating plate part to define a thermal insulation gap between the shaft part and the gap flange part and between the seating plate part and the gap flange part, the gap flange part including; a bent shape corresponding to apart of the seating plate part and a part of the shaft part; a wing portion extending along the seating plate part; and a gas inlet port and a gas outlet port so that cooling gas circulates in the thermal insulation gap, wherein a sealing member is interposed between the wing portion and the seating plate part and surrounds the shaft part to seal the thermal insulation gap, and wherein one or more cap members are interposed between the wing portion and the seating plate part to surround the sealing member.

2. The substrate support device of claim 1, wherein one or more one protruding portions each having a shape surrounding the shaft part are formed on the wing portion, and the one or more cap members are fitted with the one or more protruding portions.

3. The substrate support device of claim 1, wherein the one or more cap members comprise a pair of cap members disposed to be spaced apart from each other to define an additional thermal insulation gap between the wing portion and the seating plate part.

4. The substrate support device of claim 3, wherein the wing portion further extends to the outside of the seating plate part, and an outer cap member of the pair of cap members is disposed to support a lower side of an outer peripheral surface of the seating plate part.

5. The substrate support device of claim 1, wherein the gap flange part comprises a ring portion connected to the wing portion and extending along the shaft part while surrounding the shaft part, and the gas inlet port and the gas outlet port are formed in the ring portion.

6. The substrate support device of claim 1, wherein a heat sink flange part is coupled to a lower portion of the shaft part, and the gap flange part is fastened to the heat sink flange part.

7. The substrate support device of claim 6, wherein an O-ring is interposed between the heat sink flange part and the gap flange part to seal the thermal insulation gap.

8. The substrate support device of claim 1, further comprising:

a cooling plate detachably coupled to an outer side of the gap flange part.

9. The substrate support device of claim 8, wherein a cooling flow path is formed in the cooling plate.

10. The substrate support device of claim 1, wherein an electrostatic electrode, a heating wire, and an RF electrode are disposed in the seating plate part, and power rods connected to the electrostatic electrode, the heating wire, and the RF electrode are disposed in the shaft part.

11. A substrate support device comprising:

a seating plate part on which a substrate is seated;

a shaft part coupled to a lower portion of the seating plate part to support the seating plate part and having a lower portion to which a heat sink flange part is coupled;

a gap flange part fastened to the heat sink flange part to define a thermal insulation gap between the shaft part and the seating plate part and comprising a gas inlet port and a gas outlet port so that cooling gas circulates in the thermal insulation gap; and a cooling plate detachably coupled to an outer side of the gap flange part, wherein the gap flange part comprises:

a wing portion extending along the seating plate part; and a ring portion connected to the wing portion and extending along the shaft part while surrounding the shaft part, wherein a sealing member is interposed between the wing portion and the seating plate part and surrounds the shaft part to seal the thermal insulation gap, wherein one or more cap members are interposed between the wing portion and the seating plate part to surround the sealing member, and wherein the gap flange part includes a bent shape corresponding to a part of the seating plate part and a part of the shaft part.

* * * * *